US012692599B2

(12) United States Patent     (10) Patent No.:   US 12,692,599 B2

Ma et al.     (45) Date of Patent:   Jul. 28, 2026

---

(54) FILL VESSELS AND CONNECTORS FOR CHEMICAL SUBLIMATORS

(71) Applicant: ASM IP HOLDING B.V., Almere (NL)

(72) Inventors: Paul Ma, Phoenix, AZ (US); Carl Louis White, Gilbert, AZ (US); Eric James Shero, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 283 days.

(21) Appl. No.: 17/011,833

(22) Filed: Sep. 3, 2020

(65) Prior Publication Data

US 2021/0071301 A1     Mar. 11, 2021

Related U.S. Application Data

(60) Provisional application No. 62/898,388, filed on Sep. 10, 2019.

(51) Int. Cl.
| | |
|---|---|
| *C23C 16/455* | (2006.01) |
| *B05B 7/16* | (2006.01) |
| *B05B 11/00* | (2023.01) |
| *B05C 5/00* | (2006.01) |
| *C23C 14/24* | (2006.01) |

(52) U.S. Cl.
CPC ...... *C23C 16/45561* (2013.01); *B05B 7/1686* (2013.01); *B05B 11/0002* (2013.01); *B05C 5/001* (2013.01); *C23C 14/24* (2013.01); *C23C 14/246* (2013.01)

(58) Field of Classification Search
CPC .............................. C23C 14/24; C23C 14/246
See application file for complete search history.

(56) References Cited

U.S. PATENT DOCUMENTS

| | | | |
|---|---|---|---|
| 3,587,620 A | 6/1971 | Berthold | |
| 3,719,052 A * | 3/1973 | White | F25B 21/02 62/3.2 |

(Continued)

FOREIGN PATENT DOCUMENTS

| | | |
|---|---|---|
| CN | 1108146 | 9/1995 |
| CN | 1577745 A | 2/2005 |

(Continued)

OTHER PUBLICATIONS

English Translation—JP 11168092, Mizutani, Jun. 1999 (Year: 1999).

(Continued)

*Primary Examiner* — Keath T Chen
(74) *Attorney, Agent, or Firm* — Snell & Wilmer L.L.P.

(57) ABSTRACT

Herein disclosed are systems and methods related to solid source chemical intermediate fill vessels. The fill vessel can include a proximate end, a distal end, and a base disposed at the proximate end that is configured to hold solid source chemical reactant therein. The intermediate fill vessel can further include a lid at the distal end comprising a second thermal conductor. The lid can include a chemical inlet, a carrier gas inlet, and a chemical outlet. The fill vessel can further include an intermediate layer that is disposed between the base and the lid. The intermediate layer may include an insulator that is configured to reduce heat flow between the base and the lid.

19 Claims, 5 Drawing Sheets

(56) References Cited

U.S. PATENT DOCUMENTS

| | | | |
|---|---|---|---|
| 4,393,013 A | 7/1983 | McMenhmin | |
| 4,436,674 A | 3/1984 | McMenhmin | |
| 4,560,462 A | 12/1985 | Radford | |
| 4,722,298 A | 2/1988 | Rubin et al. | |
| 4,883,362 A | 11/1989 | Gartner et al. | |
| 4,947,790 A | 8/1990 | Gartner et al. | |
| 4,959,524 A * | 9/1990 | de Rudnay | C23C 14/28 |
| | | | 118/727 |
| 5,071,553 A | 12/1991 | Newlin | |
| 5,080,870 A | 1/1992 | Streetman et al. | |
| 5,121,707 A | 6/1992 | Kanoo | |
| 5,199,603 A | 4/1993 | Prescott | |
| 5,377,429 A | 1/1995 | Sandhu | |
| 5,380,367 A | 1/1995 | Bertone | |
| 5,465,766 A | 11/1995 | Siegele et al. | |
| 5,560,779 A | 10/1996 | Knowles et al. | |
| 5,562,132 A | 10/1996 | Siegele et al. | |
| 5,567,127 A | 10/1996 | Wentz | |
| 5,667,682 A | 9/1997 | Laird | |
| 5,709,753 A | 1/1998 | Olson | |
| 5,711,816 A * | 1/1998 | Kirlin | C23C 16/409 |
| | | | 261/DIG. 65 |
| 5,732,744 A | 3/1998 | Barr et al. | |
| 5,795,628 A | 8/1998 | Wisard | |
| 5,803,165 A | 9/1998 | Shikazono | |
| 5,807,410 A | 9/1998 | Borsboom et al. | |
| 5,836,483 A | 11/1998 | Disel | |
| 5,876,503 A | 3/1999 | Roeder | |
| 5,882,416 A * | 3/1999 | Van Buskirk | C23C 16/448 |
| | | | 261/106 |
| 5,897,850 A | 4/1999 | Borsboom et al. | |
| 5,904,771 A | 5/1999 | Tasaki et al. | |
| 5,964,254 A | 10/1999 | Jackson | |
| 6,053,704 A * | 4/2000 | Yamamoto | F04B 37/08 |
| | | | 417/52 |
| 6,083,321 A | 7/2000 | Lei et al. | |
| 6,085,548 A * | 7/2000 | Chowdhury | B01D 19/0068 |
| | | | 62/48.2 |
| 6,116,257 A | 9/2000 | Yokota | |
| 6,216,708 B1 | 4/2001 | Agarwal | |
| 6,221,306 B1 | 4/2001 | Johnson | |
| 6,270,839 B1 | 8/2001 | Onoe et al. | |
| 6,312,525 B1 | 11/2001 | Bright et al. | |
| 6,365,229 B1 | 4/2002 | Robbins | |
| 6,422,830 B1 | 7/2002 | Yamada | |
| 6,444,043 B1 | 9/2002 | Gegenwart | |
| 6,718,126 B2 | 4/2004 | Lei | |
| 6,770,145 B2 * | 8/2004 | Saito | C23C 16/18 |
| | | | 118/726 |
| 6,849,832 B2 | 2/2005 | Endo | |
| 6,889,864 B2 | 5/2005 | Lindfors et al. | |
| 6,905,541 B2 | 6/2005 | Chen et al. | |
| 6,909,839 B2 | 6/2005 | Wang et al. | |
| 6,946,034 B1 | 9/2005 | Bruce | |
| 7,018,478 B2 | 3/2006 | Lindfors et al. | |
| 7,156,380 B2 | 1/2007 | Soininen | |
| 7,186,385 B2 | 3/2007 | Ganguli et al. | |
| 7,270,709 B2 | 9/2007 | Chen et al. | |
| 7,278,887 B1 | 10/2007 | Palinkas | |
| 7,413,767 B2 | 8/2008 | Bauch | |
| 7,437,060 B2 | 10/2008 | Wang et al. | |
| 7,497,420 B2 | 3/2009 | Soininen | |
| 7,531,090 B1 | 5/2009 | Stamey | |
| 7,730,747 B2 | 6/2010 | Galante | |
| 7,763,115 B2 | 7/2010 | Hatanaka et al. | |
| 7,815,737 B2 | 10/2010 | Kim | |
| 7,833,353 B2 | 11/2010 | Furukawahara et al. | |
| 7,926,440 B1 | 4/2011 | Tombler, Jr. et al. | |
| 7,971,861 B2 | 7/2011 | Soininen | |
| 8,137,462 B2 | 3/2012 | Fondurulia et al. | |
| 8,357,241 B2 | 1/2013 | Matsumoto | |
| 8,986,456 B2 | 3/2015 | Fondurulia | |
| 9,109,287 B2 | 8/2015 | Birtcher et al. | |
| 9,593,416 B2 | 3/2017 | Fondurulia et al. | |
| 9,598,766 B2 | 3/2017 | Birtcher et al. | |
| 10,876,205 B2 | 12/2020 | Verghese et al. | |
| 11,377,732 B2 | 7/2022 | Verghese et al. | |
| 2001/0003603 A1 | 6/2001 | Eguchi et al. | |
| 2002/0108670 A1 | 8/2002 | Baker et al. | |
| 2002/0134760 A1 | 9/2002 | Rehrig | |
| 2003/0054100 A1 | 3/2003 | Eser | |
| 2003/0198741 A1 * | 10/2003 | Uchida | C23C 16/409 |
| | | | 118/726 |
| 2004/0000270 A1 | 1/2004 | Carpenter | |
| 2004/0013577 A1 | 1/2004 | Ganguli | |
| 2004/0016404 A1 | 1/2004 | Gregg et al. | |
| 2004/0159005 A1 | 8/2004 | Olander | |
| 2005/0000427 A1 * | 1/2005 | Lee | C23C 16/45544 |
| | | | 118/724 |
| 2005/0000428 A1 | 1/2005 | Shero et al. | |
| 2005/0006799 A1 * | 1/2005 | Gregg | C23C 16/4481 |
| | | | 261/DIG. 65 |
| 2005/0019026 A1 | 1/2005 | Wang et al. | |
| 2005/0019028 A1 | 1/2005 | Wang et al. | |
| 2005/0039794 A1 | 2/2005 | Birtcher | |
| 2005/0066893 A1 | 3/2005 | Soinenen | |
| 2005/0072357 A1 | 4/2005 | Shero et al. | |
| 2005/0167981 A1 | 8/2005 | Nuttall | |
| 2005/0211172 A1 | 9/2005 | Freeman | |
| 2005/0263075 A1 | 12/2005 | Wang et al. | |
| 2006/0112882 A1 | 6/2006 | Suzuki | |
| 2006/0112883 A1 | 6/2006 | Suzuki | |
| 2006/0115593 A1 | 6/2006 | Suzuki | |
| 2006/0133955 A1 | 6/2006 | Peters | |
| 2006/0185597 A1 | 8/2006 | Suzuki | |
| 2006/0185598 A1 | 8/2006 | Suzuki | |
| 2006/0199475 A1 * | 9/2006 | Cok | B23K 26/1224 |
| | | | 451/38 |
| 2006/0213437 A1 | 9/2006 | Ishizaka et al. | |
| 2006/0283382 A1 * | 12/2006 | Yoshikawa | C23C 14/564 |
| | | | 117/200 |
| 2007/0101940 A1 | 5/2007 | Iizuka | |
| 2007/0175397 A1 * | 8/2007 | Tomiyasu | C23C 16/4481 |
| | | | 118/726 |
| 2007/0235085 A1 | 10/2007 | Nakashima | |
| 2008/0047890 A1 | 2/2008 | Klein | |
| 2008/0085226 A1 | 4/2008 | Fondurulia et al. | |
| 2008/0092816 A1 | 4/2008 | Birtcher et al. | |
| 2008/0149031 A1 | 6/2008 | Chu et al. | |
| 2008/0191153 A1 | 8/2008 | Marganski et al. | |
| 2008/0241805 A1 | 10/2008 | Schantz | |
| 2009/0087545 A1 | 4/2009 | Ohmi | |
| 2009/0107401 A1 | 4/2009 | Reinhold et al. | |
| 2009/0114157 A1 | 5/2009 | Lee | |
| 2009/0133632 A1 | 5/2009 | Soininen | |
| 2009/0136668 A1 | 5/2009 | Gregg et al. | |
| 2010/0065481 A1 | 3/2010 | Formica | |
| 2010/0081104 A1 | 4/2010 | Hein et al. | |
| 2010/0242835 A1 | 9/2010 | Arena | |
| 2010/0255198 A1 | 10/2010 | Cleary | |
| 2010/0322604 A1 | 12/2010 | Fondurulia et al. | |
| 2011/0033618 A1 | 2/2011 | Noll et al. | |
| 2011/0142746 A1 * | 6/2011 | Reed | C23C 14/564 |
| | | | 118/724 |
| 2011/0146579 A1 | 6/2011 | Seo et al. | |
| 2011/0226624 A1 | 9/2011 | Dorrer | |
| 2012/0034378 A1 | 2/2012 | Woelk et al. | |
| 2012/0156108 A1 | 6/2012 | Fondurulia et al. | |
| 2012/0180899 A1 * | 7/2012 | Dickerson | F25J 1/0017 |
| | | | 165/47 |
| 2013/0192277 A1 * | 8/2013 | Tanaka | B01D 8/00 |
| | | | 62/55.5 |
| 2014/0026977 A1 * | 1/2014 | Kimmerle | C23C 16/4482 |
| | | | 137/98 |
| 2014/0174955 A1 | 6/2014 | Sasagawa | |
| 2014/0329025 A1 | 11/2014 | Cleary | |
| 2015/0145154 A1 | 5/2015 | Chandrasekharan et al. | |
| 2015/0170909 A1 | 6/2015 | Sato | |
| 2016/0305019 A1 * | 10/2016 | Birtcher | C23C 16/4481 |
| 2017/0135383 A1 | 5/2017 | Liss | |
| 2017/0250625 A1 | 8/2017 | Fan et al. | |
| 2017/0306486 A1 | 10/2017 | Quinn et al. | |

(56) References Cited

U.S. PATENT DOCUMENTS

| | | | |
|---|---|---|---|
| 2018/0094350 A1 | 4/2018 | Verghese et al. | |
| 2018/0094351 A1 | 4/2018 | Verghese et al. | |
| 2019/0139807 A1 | 5/2019 | White et al. | |
| 2020/0056283 A1 | 2/2020 | Shero et al. | |
| 2020/0199753 A1 | 6/2020 | Hidaka et al. | |
| 2021/0040613 A1 | 2/2021 | White et al. | |
| 2021/0079527 A1 | 3/2021 | White et al. | |

FOREIGN PATENT DOCUMENTS

| | | | |
|---|---|---|---|
| CN | 102234790 | | 11/2011 |
| CN | 104152870 | | 11/2014 |
| CN | 104746040 | | 7/2015 |
| GB | 2 151 662 | | 7/1985 |
| JP | S64-064314 | | 3/1989 |
| JP | H01-265511 | | 10/1989 |
| JP | H09-040489 | | 2/1997 |
| JP | H11-168092 | | 6/1999 |
| JP | 2005113221 | A | 4/2005 |
| JP | 2011176369 | A | 9/2011 |
| KR | 2011-0117021 | | 10/2011 |
| KR | 2014-0133641 | | 11/2014 |
| WO | WO 2004/106584 | | 12/2004 |
| WO | WO 2007/057631 | | 5/2007 |

OTHER PUBLICATIONS

Final Office Action dated Oct. 18, 2011 in U.S. Appl. No. 11/870,374.
Final Office Action dated Nov. 23, 2011 in U.S. Appl. No. 11/870,374.
Final Office Action dated Sep. 10, 2015 in U.S. Appl. No. 13/404,700.
Final Office Action dated Oct. 5, 2016 in U.S. Appl. No. 13/404,700.
Notice of Reasons for Rejection dated Mar. 27, 2012 for Japanese Patent Application No. 2009-532567, filed Oct. 10, 2007.
Office Action dated Jun. 23, 2011 in U.S. Appl. No. 11/870,374.
Office Action dated Sep. 27, 2013 in Korean Application No. 10-2009-7009467.
Office Action dated Jan. 21, 2015 in U.S. Appl. No. 13/404,700.
Office Action dated May 16, 2016 in U.S. Appl. No. 13/404,700.
Office Action dated Dec. 6, 2018 in U.S. Appl. No. 15/283,120.
Office Action dated Mar. 22, 2019 in U.S. Appl. No. 15/283,120.
Partial International Search Report on claims 1-9 from the International Searching Authority dated Apr. 15, 2008, in corresponding International Patent Application No. PCT/US2007/081005.

* cited by examiner

FILL VESSELS AND CONNECTORS FOR CHEMICAL SUBLIMATORS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

A typical solid or liquid source reactant delivery system includes a solid or liquid source vessel and a heater. The vessel can include a chemical reactant that is to be vaporized. A carrier gas travels through a path in the vessel, and carries vaporized and/or sublimed chemical reactant through a vessel outlet and ultimately to a substrate reaction chamber.

FIELD

The present application relates generally to systems and methods involving semiconductor processing equipment, and specifically to vaporizing systems for chemical vapor delivery.

SUMMARY

Some embodiments include a solid source chemical intermediate fill vessel comprising a proximate end, a distal end, and a base disposed at the proximate end that is configured to hold solid source chemical reactant therein. The base can include a first thermal conductor. The base can be configured to be maintained at or below a first threshold temperature. The intermediate fill vessel can further include a lid at the distal end comprising a second thermal conductor. The lid can be configured to be maintained at or above a second threshold temperature greater than the first threshold temperature. The lid can include a chemical inlet that is configured to receive sublimed or vaporized chemical reactant therethrough into the base. The lid can include a carrier gas inlet that is configured to receive a flow of a carrier gas therethrough, and the lid can include a chemical outlet that is configured to pass sublimed or vaporized chemical reactant from the lid. The fill vessel can further include an intermediate layer that is disposed between the base and the lid. The intermediate layer may comprise or consist of an insulator that is configured to reduce heat flow between the base and the lid.

Details of one or more implementations of the subject matter described in this specification are set forth in the accompanying drawings and the description herein. Other features, aspects, and advantages will become apparent from the description, the drawings, and the claims. Neither this summary nor the following detailed description purports to define or limit the scope of the inventive subject matter.

BRIEF DESCRIPTION OF THE DRAWINGS

These and other aspects of the disclosure will be readily apparent to the skilled artisan in view of the description herein, the appended claims, and from the drawings, which are intended to illustrate and not to limit the invention, and wherein:

DETAILED DESCRIPTION

Figure 1:
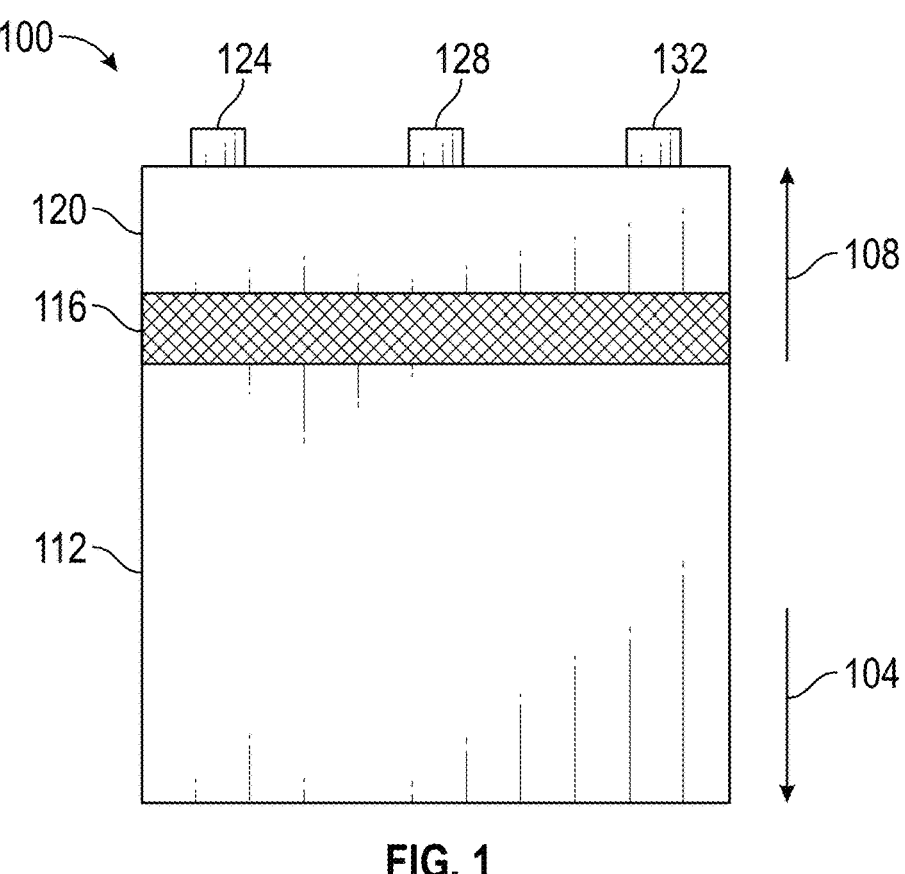
FIG. 1 schematically shows an example fill vessel, according to some configurations.

The headings provided herein, if any, are for convenience only and do not necessarily affect the scope or meaning of the claimed invention. Described herein are systems and related methodologies for delivering vaporized or sublimed reactant in a high capacity deposition module.

The following detailed description details certain specific embodiments to assist in understanding the claims. However, one may practice the present invention in a multitude of different embodiments and methods, as defined and covered by the claims.

A chemical reactant or solid source delivery system can include a solid or liquid source vessel and a heater (e.g., a radiant heat lamp, resistive heater, and/or the like). The vessel includes the source precursor (which may also be referred to as "chemical precursor"), and which can be a solid (e.g., in powder form) or liquid. The heater heats up the vessel to facilitate the vaporization and/or sublimation of the reactant in the vessel. The vessel can have an inlet and an outlet for the flow of a carrier gas (e.g., $N_2$) through the vessel. The carrier gas may be inert, for example nitrogen, argon, or helium). Generally, the carrier gas conveys reactant vapor (e.g., evaporated or sublimated chemical reactant) along with it through the vessel outlet and ultimately to a substrate reaction chamber. The vessel typically includes isolation valves for fluidly isolating the contents of the vessel from the vessel exterior. One isolation valve may be provided upstream of the vessel inlet, and another isolation valve may be provided downstream of the vessel outlet. The source vessel of some embodiments comprises, consists essentially of, or consists of a sublimator. As such, wherever a "source vessel" is mentioned herein, a sublimator (such as a "solid source chemical sublimator") is also expressly contemplated.

Chemical vapor deposition (CVD) is a known process in the semiconductor industry for forming thin films of materials on substrates such as silicon wafers. In CVD, reactant vapors (including "precursor gases") of different reactant chemicals are delivered to one or more substrates in a reaction chamber. In many cases, the reaction chamber includes only a single substrate supported on a substrate holder (such as a susceptor), with the substrate and substrate holder being maintained at a desired process temperature. In typical CVD processes, mutually reactive reactant vapors react with one another to form thin films on the substrate, with the growth rate being related to the temperature and the amounts of reactant gases. In some variants, energy to drive the deposition reactants is supplied in whole or in part by plasma.

In some applications, the reactant gases are stored in gaseous form in a reactant source vessel. In such applications, the reactants are often gaseous at standard pressures and temperatures of around 1 atmosphere and room temperature. Examples of such gases include nitrogen, oxygen, hydrogen, and ammonia. However, in some cases, the vapors of source chemicals ("precursors") that are liquid or solid (e.g., hafnium chloride, hafnium oxide, zirconium dioxide, etc.) at standard pressure and temperature are used. For some solid substances (referred to herein as "solid source precursors", "solid chemical reactants", or "solid reactants"), the vapor pressure at room temperature is so low that they are typically heated and/or maintained at very low pressures to produce a sufficient amount of reactant vapor for the reaction process. Once vaporized (e.g., sublimed or evaporated), keeping the vapor phase reactant at or above the vaporizing temperature through the processing system can prevent undesirable condensation in the valves, filters, conduits, and other components associated with delivering the vapor phase reactants to the reaction chamber. Vapor phase reactants from such naturally solid or liquid substances are useful for chemical reactions in a variety of other industries.

Atomic layer deposition (ALD) is another known process for forming thin films on substrates. In many applications, ALD uses a solid and/or liquid source chemical as described herein. ALD is a type of vapor deposition wherein a film is built up through self-saturating reactions performed in cycles. The thickness of the film is determined by the number of cycles performed. In an ALD process, gaseous reactants are supplied, alternatingly and/or repeatedly, to the substrate or wafer to form a thin film of material on the wafer. One reactant adsorbs in a self-limiting process on the wafer. A different, subsequently pulsed reactant reacts with the adsorbed material to form a single molecular layer of the desired material. Decomposition may occur through mutual reaction between the adsorbed species and with an appropriately selected reagent, such as in a ligand exchange or a gettering reaction. In some ALD reactions, no more than a molecular monolayer forms per cycle. Thicker films are produced through repeated growth cycles until the target thickness is achieved.

In some ALD reactions, mutually reactive reactants are kept separate in the vapor phase with intervening removal processes between substrate exposures to different reactants. For example, in time-divided ALD processes, reactants are provided in pulses to a stationary substrate, typically separated by purging or pump down phases; in space-divided ALD processes, a substrate is moved through zones with different reactants; and in some processes aspects of both space-divided and time-divided ALD can be combined. The skilled artisan will appreciate that some variants or hybrid processes allow some amount of CVD-like reactions, either through selection of the deposition conditions outside the normal ALD parameter windows and/or through allowing some amount of overlap between mutually reactive reactants during exposure to the substrate.

Reactant source vessels are normally supplied with gas lines extending from the inlet and outlet, isolation valves on the lines, and fittings on the valves, the fittings being configured to connect to the gas flow lines of the remaining substrate processing apparatus. It is often desirable to provide a number of additional heaters for heating the various valves and gas flow lines between the reactant source vessel and the reaction chamber, to prevent the reactant vapor from condensing and depositing on such components. Accordingly, the gas-conveying components between the source vessel and the reaction chamber are sometimes referred to as a "hot zone" in which the temperature is maintained above the vaporization/condensation/sublimation temperature of the reactant.

Various vessels may be included for filling the reactant source vessels with source precursor as described herein. The vessels may include "intermediate fill" vessels or "transfill" vessels (for conciseness, the intermediate fill vessel or transfill vessel may be referred to herein simply as a "fill vessel"). Conventionally, source vessels are removed and refilled from a reactor system, which can lead to downtime and a loss of wafer production. The transfill vessels can advantageously reduce a need to replace or refill a sublimator. Instead, the transfill vessel can be used to automatically and/or continuously supply the a reactor system with source precursor. A fill chamber system can include one or more transfill vessels. Furthermore, transfill vessels in accordance with embodiments herein can be disposed near, adjacent, or within a reactor system. Having the transfill vessel in proximity to the reactor system can reduce the need for long pipes, reduce the chance of condensation inside piping, and or reduce a need for unnecessary fluidic elements. However, since the transfill vessel does not need to be removed from a reactor system for refilling, the transfill vessel can achieve advantages of disposition proximal to or within reactor systems (such as relatively short flow paths), without the labor and downtime associated with refilling. Additional features are described herein with reference to various configurations.

Another advantage of various transfill vessels described herein relates to a temperature gradient that can be achieved within the transfill vessel. Generally, chemical precursor may be contained (e.g., stored) within a transfill vessel in a solid state and may be sublimed or vaporized to be passed to another location (e.g., a deposition module or a reaction chamber). In some configurations, carrier gas may be used to carry the evaporated chemical precursor from the transfill vessel to another location (e.g., to a deposition module or to a reaction chamber). Thus, a base of the transfill vessel may preferably be at a relatively low temperature (e.g., to maintain the precursor as a solid) and a lid of the transfill vessel may preferably be at a relatively high temperature (e.g., to facilitate the precursor entering the vapor phase to allow it be carried elsewhere, while minimizing condensation in the valves and downstream flow path). As described herein, an intermediate layer may be employed to help maintain temperature gradient within the transfill vessel. The intermediate layer can include an insulating material that reduces and/or inhibits thermal communication between the lid and the base.

FIG. 1 schematically shows an example fill vessel 100, according to some configurations. The fill vessel 100 can contain a chemical reactant, example a solid or liquid source precursor. A "solid source precursor" has its customary and ordinary meaning in the art in view of this disclosure. It refers to a source chemical that is solid under standard conditions (i.e., room temperature and atmospheric pressure). In some embodiments, the fill vessel 100 can include a base 112, a lid 120, and an intermediate section 116. The fill vessel 100 may define a vessel axis that extends in a proximal direction 104 and a distal direction 108. The vessel axis may be oriented in an "up" and "down" orientation with reference to FIG. 1. As shown, the base 112 is disposed proximal to the intermediate section 116 and the lid 120. FIG. 1 should not be viewed as limiting the number of elements the fill vessel 100 can contain, as described herein. The intermediate section 116 may be disposed between the base 112 and the lid 120. In some embodiments, the lid 120 is adapted to be mechanically attached to the intermediate section 116. This may be done using one or more of attachment devices (e.g., bolts, screws, etc.). In certain embodiments, the lid 120 and/or the base 112 are mechanically attached to the intermediate section 116 in a gas-tight fashion. In some embodiments, the base 112 is detachably immobilized on the intermediate section 116.

The intermediate section 116 can be a disposed between the base and the lid. The intermediate section 116 may be disposed in contact with both the base 112 and the lid 120. The intermediate section 116 can include an insulator that is configured to reduce and/or inhibit heat flow between the base 112 and the lid 120. The intermediate section 116 can include one or more individual chambers. One or more of the chambers can include a vacuum. The intermediate section 116 can be configured to maintain a temperature gradient between the base 112 and the lid 120, so that the base 112 can be maintained at or below a first threshold temperature, while the lid 120 can be maintained at or above a second threshold temperature that is greater than the first threshold temperature. For example, such that the base 112 and the lid 120 may be maintained at a difference in temperature (e.g., a different between the second threshold temperature and the first threshold temperature). For example, the difference in temperature between the base and the lid can be at least about 1° C., about 2° C., about 3° C., about 4° C., about 5° C., about 6° C., about 7° C., about 8° C., about 9° C., about 10° C., about 11° C., about 12° C., about 13° C., about 14° C., about 15° C., about 18° C., about 20° C., about 25° C., about 30° C., any value therebetween, or fall within any range having endpoints therein, for example about 1° C. to about 5° C., about 1° C. to about 10° C., about 1° C. to about 15° C., about 1° C. to about 20° C., about 1° C. to about 25° C., about 5° C. to about 10° C., about 5° C. to about 15° C., about 5° C. to about 20° C., about 5° C. to about 25° C., about 10° C. to about 15° C., about 10° C. to about 20° C., or about 10° C. to about 25° C. The gradient can be disposed across a distance (e.g., axial distance) of about 1 inch, about 2 inches, about 3 inches, about 6 inches, about 9 inches, about 12 inches, about 15 inches, about 18 inches, about 21 inches, about 24 inches, about 27 inches, about 30 inches, about 33 inches, about 36 inches, any value therebetween, or fall within any range having endpoints therein, for example about 3 to about 9 inches, about 3 to about 12 inches, about 3 to about 24 inches, about 3 to about 36 inches, about 9 to about 12 inches, about 9 to about 24 inches, about 9 to about 36 inches, about 12 to about 24 inches, about 12 to about 36 inches, or about 24 to about 36 inches.

The fill vessel 100 can include one or more heating and/or cooling elements (not shown). A cooling element (e.g., a water cooler or cooling plate) may be disposed near a proximal portion of the base 112. Additionally or alternatively, a heating element (e.g., a heating rod, a heating filament, a heating plate, and/or heating fins) may be disposed at or near a distal portion of the lid 120. Thus, the intermediate section 116 may be able to reduce and/or inhibit heat flow between an actively heated portion (e.g., the lid 120) and an actively cooled portion (e.g., of the base 112) of the fill vessel 100. The use of heating and/or cooled elements can provide more precise control of temperature gradients and/or temperatures. In some examples, the cooling element(s) is/are disposed proximal of the base 112. The one or more cooling elements may be disposed adjacent (e.g., in contact with) the base 112. Additionally or alternatively, the one or more heating elements may be disposed distal of the lid 120. The cooling elements may include fluid cooled elements (e.g., water cooled, air cooled, etc.). The heating elements may include a heating rod, a heating filament, heating plate, heating fins, or any other type of heating element. The one or more heating elements may be configured to heat the lid 120 and/or one or more valves of the via radiation. In some examples, a heating element may heat the lid 120 via conduction.

The ratio of the height of the lid 120 to the intermediate section 116 can be such that the temperature gradient is disposed at an advantageous distance from one or more valves of the lid 120, for example to keep these valves at a sufficiently high temperature (e.g., at or above the second threshold temperature) so as to minimize condensation in the valves of the lid 120. The ratio of a height of the lid to a height of the intermediate layer can be greater than about 1, greater than about 1.5, greater than about 2, greater than about 3, greater than about 4, greater than about 5, greater than about 6, greater than any value therebetween, or fall within any range having endpoints therein. The intermediate section 116 can include a ceramic, metal, or other structural material.

It may be advantageous to minimize the volume or footprint that the fill vessel 100 would entail, for example so that it may be disposed within a reactor system. Compact vessel assemblies can reduce such a footprint. In certain embodiments, each fill vessel 100 can have an area (e.g., on which the fill vessel 100 is placed) of between about 40 cm$^2$ and 150 cm$^2$.

The intermediate section 116 can include one or more evacuated sections that are configured to prevent the flow of heat therethrough. For example, the intermediate section 116 can include a plurality of spaced evacuated sections. The fill vessel 100 can include one or more vacuum pumps (not shown) for evacuating the evacuated sections. In some configurations, the vacuum pumps are disposed between evacuated sections of the fill vessel 100.

The lid 120 can include one or more inlets and/or outlets. The inlets and/or outlets can include corresponding valves. As shown in FIG. 1, the lid 120 can include a chemical inlet 124, a carrier gas inlet 128, and a chemical outlet 132. The chemical inlet 124 can be configured to receive chemical therethrough. The chemical may be in a sublimed or evaporated form (e.g., coupled with a carrier gas) as it enters the fill vessel 100 (e.g., from a larger bulk fill vessel).

The carrier gas inlet 128 can allow flow of a carrier gas therethrough. The carrier gas inlet 128 can include a valve coupled to the carrier gas inlet 128 of the fill vessel 100. The carrier gas can couple with sublimed or evaporated chemical within the fill vessel 100. The effluent from the fill vessel 100 then includes the carrier gas and the reactant gas vaporized from within the interior of the fill vessel 100. In some embodiments, an interior of the fill vessel 100 is configured to contain a headspace after it is filled with chemical reactant. The headspace can be in fluid communication with the chemical inlet 124, the carrier gas inlet 128, and/or the chemical outlet 132, and can be configured for sublimation of the chemical reactant by the fluid (e.g., carrier gas) in the headspace. Accordingly, the headspace can provide a failsafe so that the chemical reactant can continue to be sublimed or evaporated even if one or more of the inlets/outlets is clogged.

Inactive or inert gas is preferably used as the carrier gas for the vaporized precursor. The inert gas (e.g., nitrogen, argon, helium, etc.) may be fed into the fill vessel 100 through the carrier gas inlet 128. In some embodiments, different inert gases may be used for various processes and in various systems described herein. It will be appreciated that additional valves and/or other fluidic control elements may be included that are not shown.

The effluent (e.g., carrier gas plus evaporated chemical) can pass through the chemical outlet 132. The chemical outlet 132 can be in communication with a reaction chamber or deposition module and/or another fill vessel. In some configurations, the chemical outlet 132 is configured to pass the evaporated chemical (e.g., with the carrier gas) to the reaction chamber or deposition module, for example, in preparation for a downstream chemical reaction. One or more of the chemical inlet 124, the carrier gas inlet 128, and the chemical outlet 132 can include a corresponding valve configured to control a flow of gas therethrough. Additional information about example solid source chemical sublimators and/or fluidics thereof may be found in U.S. Pat. No. 8,137,462, issued on Mar. 20, 2012 and titled "PRECURSOR DELIVERY SYSTEM," which is hereby incorporated by reference herein in its entirety for all purposes. It will be appreciated that additional valves and/or other fluidic elements may be included that are not shown. Additional valves and other fluidic elements may be included that are not shown in certain configurations.

In certain configurations, the base 112 is adapted to hold solid source chemical. The base 112 may comprise a substantially planar surface for holding the chemical reactant, but other shapes and variants are possible. The fill vessel 100 can define an interior, such as the space between the interior of the walls a ceiling of the fill vessel 100 and a floor of the base 112. In some embodiments, the interior is configured to contain chemical reactant such as solid source chemical. The fill vessel 100 or portions thereof may be formed in a variety of ways. For example, the fill vessel 100 may include two or more lateral sections that are stacked and/or attached to one another.

In some embodiments, a height of the assembly of the fill vessel 100 can be in the range of about 25 cm-120 cm. In some embodiments, the height can be in the range of about 50 cm-100 cm, and is about 60 cm (about 24 inches) in some embodiments. In some embodiments, the width (e.g., diameter) of the fill vessel 100 can be in the range of about 20 cm-50 cm. In some embodiments, the width of the fill vessel 100 can be in the range of about 30 cm-40 cm, and is about 38 cm (about 15 inches) in certain embodiments. In some embodiments, the vessel 104 can have a height: diameter aspect ratio in the range of about 1-4. In some embodiments, the vessel occupies a shape approximating a cylinder, but other shapes are possible. As such, in some embodiments, the housing 110 comprises, consists essentially of, or consists of a cylindrical shape. In some embodiments, the mass of the fill vessel 100 (unfilled) in various embodiments described herein can range from about 10 kg-50 kg. In some embodiments, the mass of the filled fill vessel 100 can be in the range of about 35 kg-85 kg. Lower masses of vessels can allow for easier transportation, but higher masses can facilitate higher volume reactant, necessitate fewer refills, and allow for longer fills for sublimators.

Figure 2:
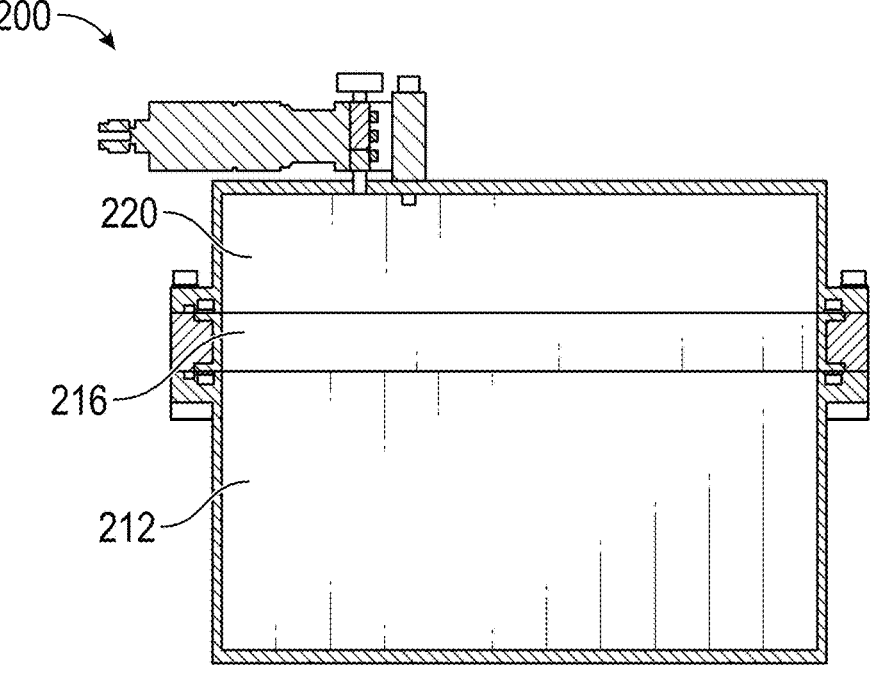
FIG. 2 shows a side view of an example fill vessel.
Figure 3:
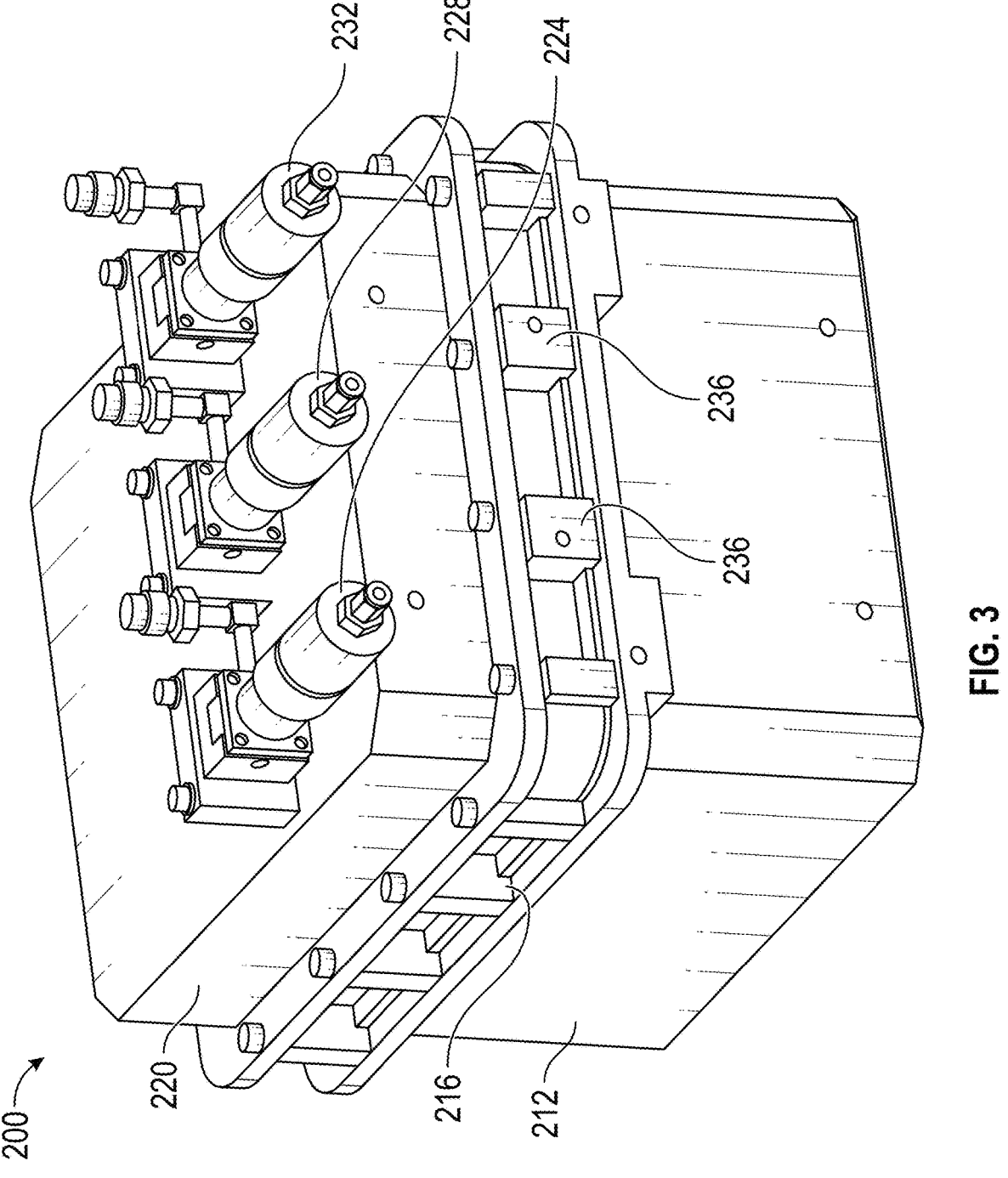
FIG. 3 shows a perspective view of the fill vessel of FIG. 2.

FIGS. 2-3 show another example fill vessel 200 of some embodiments. FIG. 2 shows a side view of the example fill vessel 200. The fill vessel 200 can include a base 212, an intermediate section 216, and a lid 220. FIG. 3 shows a perspective view of the fill vessel 200. As shown, the fill vessel 200 includes a chemical inlet 224, a carrier gas inlet 228, and a chemical outlet 232. Each of the chemical inlet 224, carrier gas inlet 228, and chemical outlet 232 includes a corresponding valve for controlling the flow of gas therethrough. The fill vessel 200 can include features described herein with respect to the fill vessel 100 described herein. Corresponding elements may have similar functionality as well.

The fill vessel 200 shown in FIG. 3 includes a plurality of insulating chambers 236. Each insulating chambers 236 can include an insulator, such as an evacuated interior, to prevent the flow of heat therethrough. Additionally or alternatively, the insulating chambers 236 can include an insulating material.

The fill vessel 200 may include separate lid 220 and sidewalls of the base 212 (as shown) or be formed from a single structure. The lid 220 may have a circular or rectangular cross sectional shape, though other shapes are also suitable. In some embodiments, the lid 220 and/or the base 212 are fluidly sealed with the intermediate section 216 such that gas substantially cannot enter and/or escape the fill vessel 200. The chemical reactant can be housed in the interior of the fill vessel 200.

The illustrated fill vessel 200 may be coupled (directly or indirectly) to a deposition module that is particularly suited for delivering vapor phase reactants to be used in one or more vapor phase reaction chambers. The vapor phase reactants can be used for chemical deposition (CVD) or Atomic Layer Deposition (ALD). In some embodiments, control processors and programming stored on computer-readable media are included such that the systems and methods of embodiments disclosed herein are configured to perform ALD. In certain embodiments, control processors and programming stored on computer-readable media are included such that the embodiments disclosed herein are configured to perform CVD.

Figure 4:
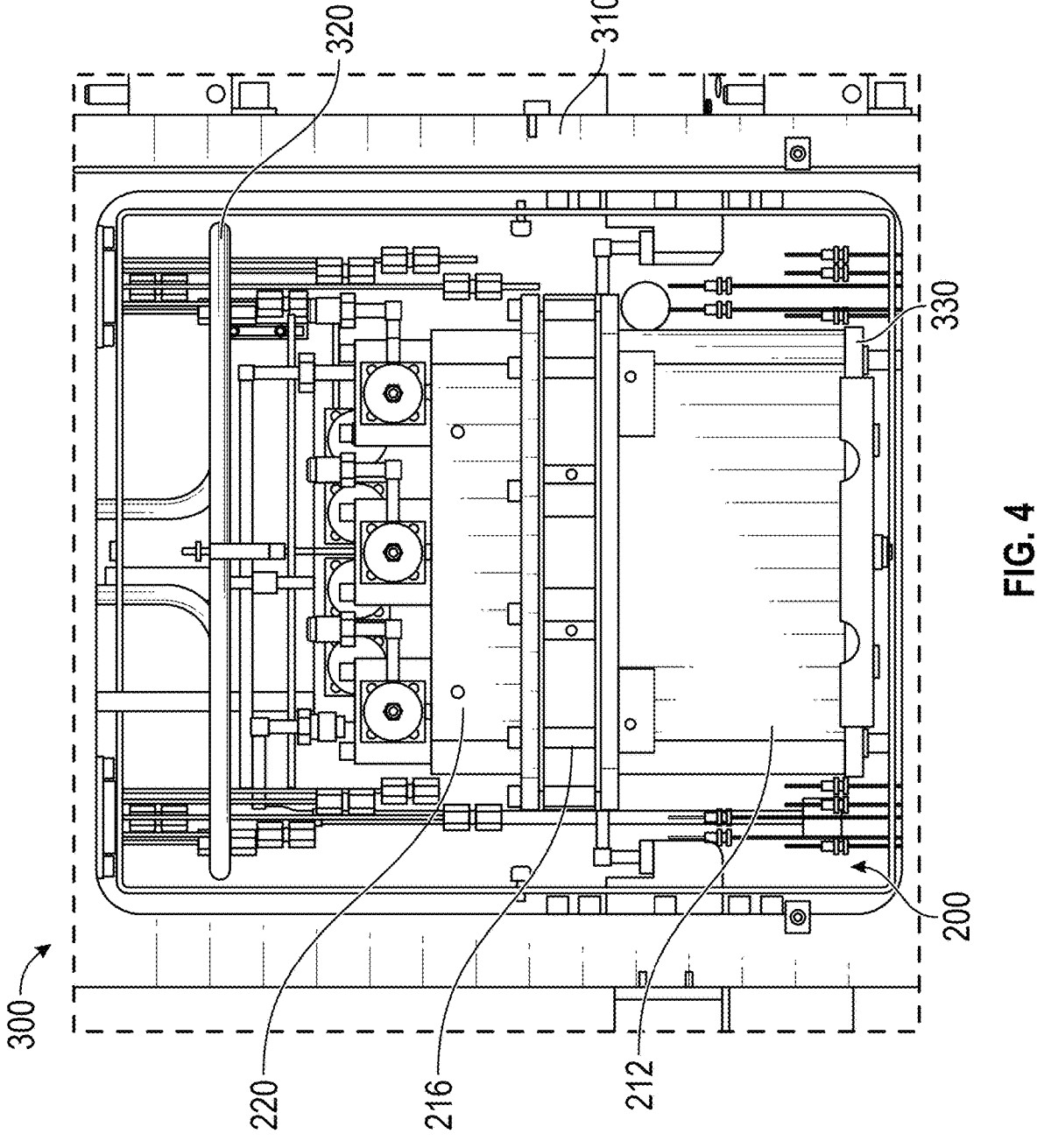
FIG. 4 shows a side view of the example fill chamber system.
Figure 5:
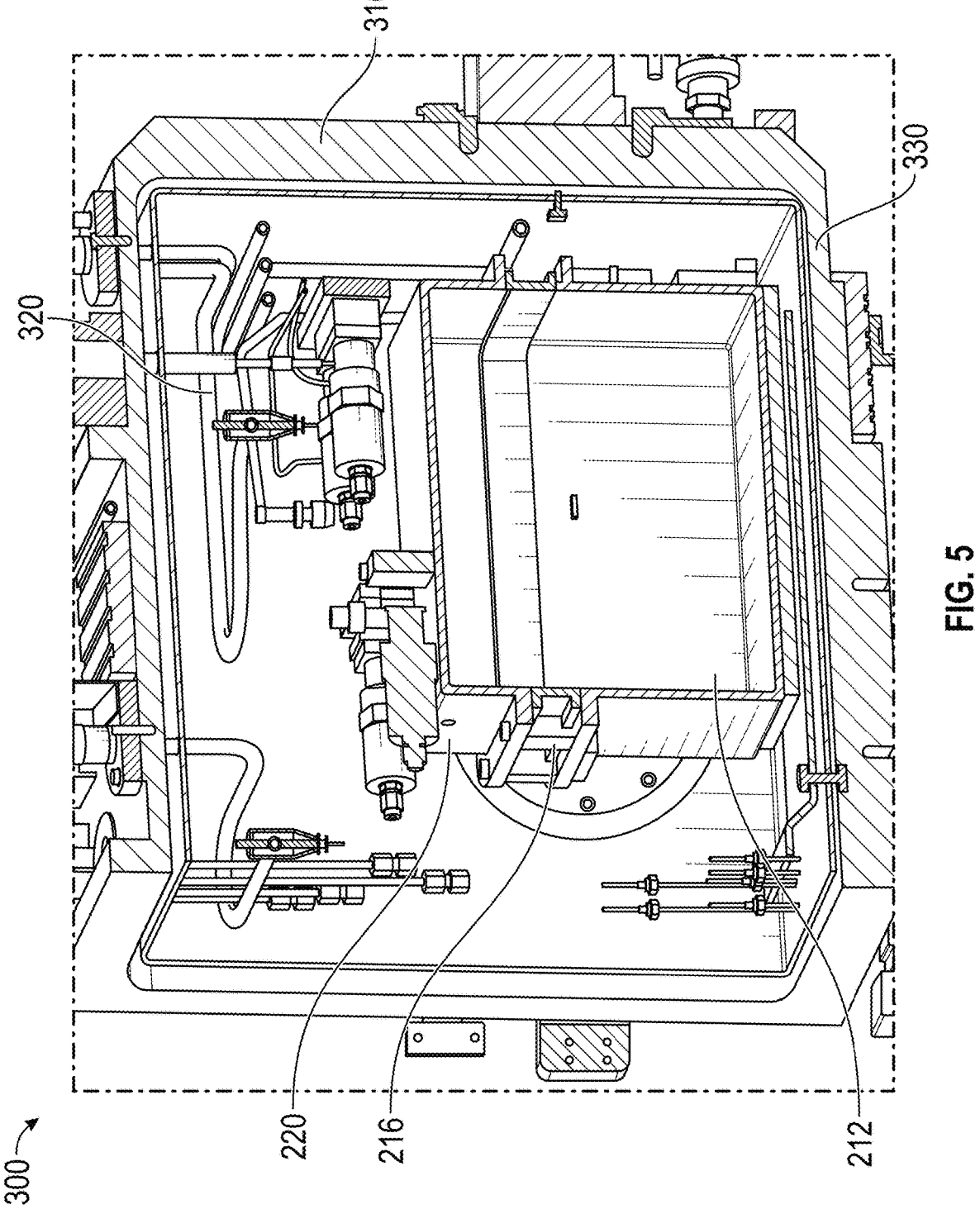
FIG. 5 shows a perspective view of a cross section of the fill chamber system shown in FIG. 4.

FIGS. 4-5 show an example fill chamber system 300 that includes a fill vessel 200 therein. FIG. 4 shows a side view of the example fill chamber system 300. The fill chamber system 300 can include a fill chamber housing 310. The fill vessel 200 can be disposed within a fill chamber housing 310. The fill chamber housing 310 can be configured to reduce thermal communication with any elements outside the fill chamber system 300. The fill chamber housing 310 can be substantially hollow and may have an exterior shape of a rectangular prism or cylinder. The fill chamber system 300 can include a heating element 320 and/or a cooling element 330. The heating element 320 can be disposed distal of the fill vessel 200. The heating element 320 can include functionality of the one or more heating elements described herein. The cooling element 330 can be disposed proximal of the fill vessel 200. In some examples, the cooling element 330 is water cooled. The cooling element 330 can be disposed adjacent (e.g., in contact with) the base 212.

FIG. 5 shows a perspective view of a cross section of the fill chamber system 300 shown in FIG. 4. The heating element 320 can include a partial loop and may be a filament. The cooling element 330 can be a cooling plate. The fill chamber system 300 can include additional elements, such as valves, inlets, outlets, heating elements, cooling elements, support structures, and/or other elements. For example, in some embodiments, the fill vessel 200 can be associated with one or more controllers (not shown) that can be configured to instruct a system (such as a reactor system) to perform ALD, as described in more detail herein. In some embodiments, the one or more controllers include processors and memory programmed to instruct a system (such as a reactor system) to perform ALD. The one or more controllers can be configured to control any heaters in the deposition module, pumps, valves to pumps for pressure control, robotic control for substrate handling, and/or valves for control of vapor flow, including carrier flow to and vapor flow from the fill vessel 200.

In some embodiments, the fill vessel 200 can include one or more heating elements. In some embodiments, one or more of the heating elements can be disposed vertically adjacent or vertically proximate the fill vessel 200. In some embodiments, the one or more heating elements is configured to heat the sublimator 100 by conduction. In certain embodiments, a heater plate that is disposed lateral of the lid 220. In certain embodiments, a heater can be disposed distal to the housing 110. In some embodiments, one or more valves may be heated conductively and/or radiantly. The fill vessel 200 may be placed in a cabinet (e.g., the fill chamber housing 310) that is configured to be gas tight to allow pumping down to low pressures, such as between about 0.1 Torr and 20 Torr, e.g., about 5 Torr, and thus facilitate efficient radiant heating minimal conductive or convective losses to the atmosphere within the cabinet. In some configurations, the fill vessel 200 can be placed in higher pressures, such as 100 Torr, 200 Torr, 300 Torr, 500 Torr, or at atmospheric pressure. Other pressures are possible. In some embodiments, the solid source assembly (as disclosed herein) can operate at a target vacuum pressure. In some embodiments, the target vacuum pressure can be in the range of about 0.5 Torr-20 Torr, such as 5 Torr. In certain embodiments, the vacuum pressure in the solid source assembly can be regulated using one or more pressure controllers.

Figure 6:
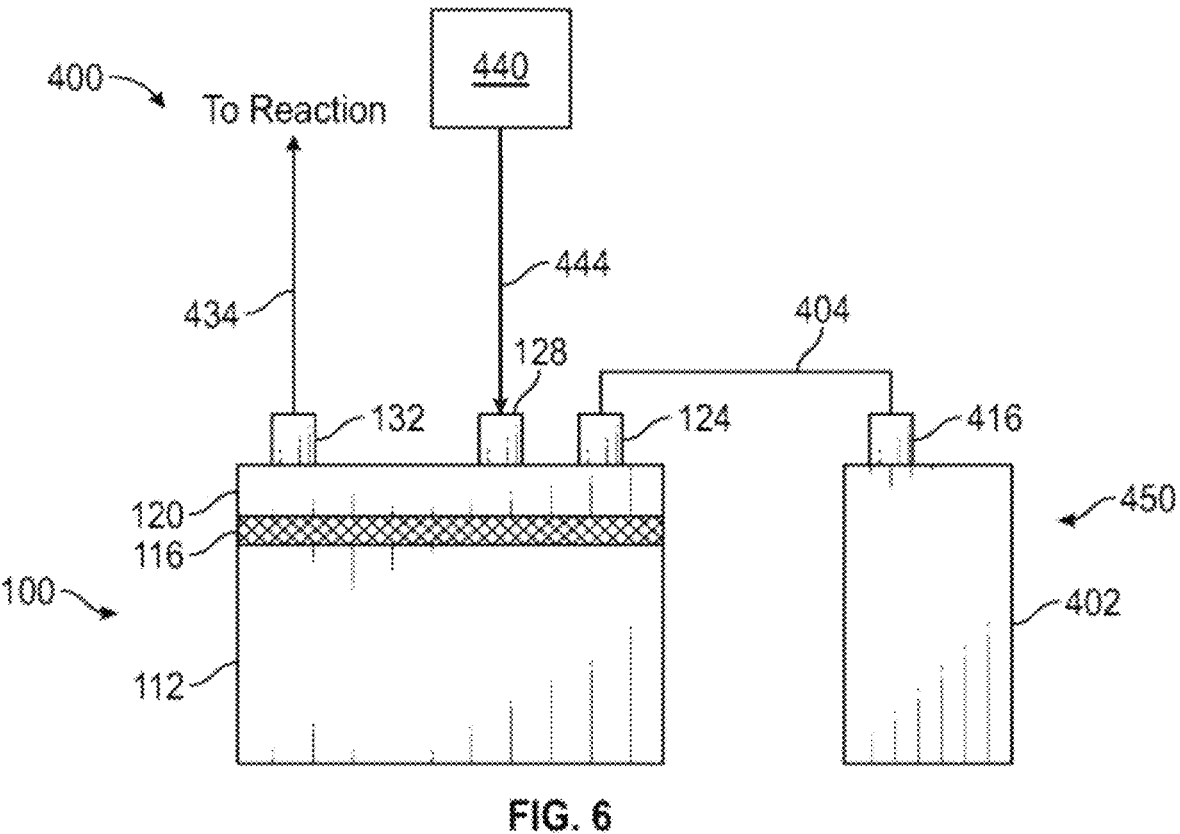
FIG. 6 shows an example solid source chemical system that includes a fill vessel, a solid source chemical sublimator, a chemical source, and a carrier gas source.

FIG. 6 shows an example solid source chemical system 400 that includes a fill vessel 100, a chemical source vessel 450, and a carrier gas source 440. The chemical source vessel 450 can be coupled to the fill vessel 100 via a chemical delivery line 404. The chemical source vessel 450 can include a larger chemical source vessel, such as a bulk fill vessel. The chemical source vessel (e.g., bulk fill vessel) may be a similar vessel as the fill vessel 100, though the source vessel may be have a larger chemical capacity in its housing 402, for example at least 1.5×, 2×, 3×, 4×, 5×, 10×, or 20× the capacity of the fill vessel 100. The carrier gas source 440 can include a source of the carrier gas, such as one described herein. The chemical source vessel 450 can pass chemical therein to the fill vessel 100 via a chemical delivery line 404. The chemical can be vaporized (e.g., sublimated, evaporated) before passing through the chemical delivery line 404.

The chemical outlet 132 can pass the vaporized chemical (e.g., with the carrier gas) through the reaction flow line 434 to the reaction (e.g., reaction chamber). The fill vessel 100 can have additional or alternative features disclosed, for example, in U.S. Patent Application Publication No. 2018/0094350, filed on Sep. 30, 2016, titled "REACTANT VAPORIZER AND RELATED SYSTEMS AND METHODS," which is hereby incorporated by reference herein in its entirety for all purposes.

In some embodiments, the electronics and/or computer elements for use in controlling one or more reaction chambers and/or one or more fill vessels (e.g., the fill vessel 100, the fill vessel 200) can be found elsewhere in the system. For example, central controllers may control both apparatus of the one or more chambers themselves as well as control the valves that connect to the various vessels and any associated heaters. One or more valves may be used to control the flow of gas throughout the solid source chemical system 400.

Illustrative Examples

Below is a set of nonlimiting examples of embodiments described above.

In a 1st example, a solid source chemical intermediate fill vessel comprises: a proximate end; a distal end; a base at the proximate end configured to hold solid source chemical reactant therein, the base comprising a first thermal conductor and configured to be maintained at or below a first threshold temperature; a lid at the distal end comprising a second thermal conductor and configured to be maintained at or above a second threshold temperature greater than the first threshold temperature, the lid comprising: a chemical inlet configured to receive vaporized chemical reactant into the base; a carrier gas inlet configured to receive a flow of a carrier gas therethrough; and a chemical outlet configured to pass vaporized chemical reactant from the lid; and an intermediate layer disposed between the base and the lid, the intermediate layer comprising an insulator configured to reduce heat flow between the base and the lid.

In a 2nd example, the intermediate fill vessel of example 1, wherein the intermediate layer comprises one or more chambers each comprising a vacuum.

In a 3rd example, the intermediate fill vessel of any of examples 1-2, wherein the intermediate layer is disposed in contact with both the base and the lid.

In a 4th example, the intermediate fill vessel of any of examples 1-3, further comprising a cooling element configured to maintain the base at or below the first threshold temperature.

In a 5th example, the intermediate fill vessel of example 4, wherein the cooling element comprises a water-cooled element thermally coupled to the base.

In a 6th example, the intermediate fill vessel of any of examples 1-5, wherein the first threshold temperature is about 135° C.

In a 7th example, the intermediate fill vessel of any of examples 1-6, wherein the second threshold temperature is about 145° C.

In an 8th example, the intermediate fill vessel of any of examples 1-7, further comprising a heating element configured to maintain the lid at or above the first threshold temperature.

In a 9th example, the intermediate fill vessel of any of examples 1-8, wherein the cooling element comprises a water-cooled element thermally coupled to the base.

In a 10th example, the intermediate fill vessel of example 9, wherein the heating element comprises a rod or plate configured to heat the lid via radiation.

In an 11th example, the intermediate fill vessel of any of examples 1-10, wherein each of the chemical inlet, the carrier gas inlet, and the chemical outlet comprise a corresponding valve configured to control a flow of gas therethrough.

In a 12th example, the intermediate fill vessel of any of examples 1-11, wherein the chemical outlet comprise filter configured to prevent a passage of particulate matter therethrough.

In a 13th example, the intermediate fill vessel example 12, wherein a porosity of the filter is configured to prevent a passage of the reactant therethrough below the second threshold temperature and to allow a passage of the reactant therethrough at or above the second threshold temperature.

In a 14th example, the intermediate fill vessel of any of examples 12-13, wherein the filter comprises at least one of a ceramic or a metal.

In a 15th example, the intermediate fill vessel of any of examples 1-14, wherein a ratio of a height of the base to a height of the lid is greater than about 4.

In a 16th example, the intermediate fill vessel of any of examples 1-15, wherein the intermediate layer is configured to maintain a temperature gradient between the lid and the base of at least 10° C.

In a 17th example, the intermediate fill vessel of any of examples 1-16, wherein a ratio of a height of the lid to a height of the intermediate layer is greater than about 2.

In a 18th example, the intermediate fill vessel of any of examples 1-17, wherein a cross section of the base comprises at least two flat edges.

In a 19th example, the intermediate fill vessel of any of examples 1-18, wherein the intermediate layer comprises a ceramic or metal.

In a 20th example, the intermediate fill vessel of any of examples 1-19, wherein the intermediate fill vessel is sized to be disposed in situ in a solid source chemical reaction chamber.

In a 21st example, the intermediate fill vessel of any of examples 1-19, wherein the intermediate fill vessel in an unfilled state has a mass of between about 10 kg and 50 kg.

In a 22nd example, a solid source chemical system comprising: the intermediate solid source chemical vessel of any of examples 1-21; and a solid source chemical sublimator in fluid communication with the intermediate vessel, the solid source chemical sublimator comprising: a housing having an inner space and an inner surface facing the inner space; and a filter having a first end and a second end, the filter having a porosity configured to restrict a passage of a solid chemical reactant therethrough, the filter shaped and positioned to define a flow path surrounding the filter in a space between the filter and the inner surface.

In a 23rd example, a method of providing vaporized chemical reactant to a reaction chamber, the method comprising: continuously flowing vaporized chemical reactant into the chemical inlet of the intermediate fill vessel of any of examples 1-21, wherein the lid is maintained at a higher temperature than the base, whereby the vaporized chemical reactant condenses in the base; sublimating the condensed chemical reactant in the base; and flowing the sublimated chemical reactant through the outlet to a reaction chamber.

Other Considerations

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than restrictive sense.

Indeed, it will be appreciated that the systems and methods of the disclosure each have several innovative aspects, no single one of which is solely responsible or required for the desirable attributes disclosed herein. The various features and processes described herein may be used independently of one another, or may be combined in various ways. All possible combinations and subcombinations are intended to fall within the scope of this disclosure.

Certain features that are described in this specification in the context of separate embodiments also may be implemented in combination in a single embodiment. Conversely, various features that are described in the context of a single embodiment also may be implemented in multiple embodiments separately or in any suitable subcombination. Moreover, although features may be described herein as acting in certain combinations and even initially claimed as such, one or more features from a claimed combination may in some cases be excised from the combination, and the claimed combination may be directed to a subcombination or variation of a subcombination. No single feature or group of features is necessary or indispensable to each and every embodiment.

It will be appreciated that conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted may be incorporated in the example methods and processes that are schematically illustrated. For example, one or more additional operations may be performed before, after, simultaneously, or between any of the illustrated operations. Additionally, the operations may be rearranged or reordered in other embodiments. In certain circumstances, multitasking and parallel processing may be advantageous. Moreover, the separation of various system components in the embodiments described herein should not be understood as requiring such separation in all embodiments, and it should be understood that the described components and systems may generally be integrated together in a single product or packaged into multiple products (for example, a filter insert and a source vessel comprising a housing and base). Additionally, other embodiments are within the scope of the following claims. In some cases, the actions recited in the claims may be performed in a different order and still achieve desirable results.

Accordingly, the claims are not intended to be limited to the embodiments shown herein, but are to be accorded the widest scope consistent with this disclosure, the principles and the features disclosed herein. For example, although many examples within this disclosure are provided with respect to supplying vapor from solid sources for feeding deposition chambers for semiconductor fabrication, certain embodiments described herein may be implemented for a wide variety of other applications and/or in numerous other contexts.

What is claimed is:

1. A solid source chemical intermediate fill vessel comprising:
   a proximate end;
   a distal end;
   a base at the proximate end configured to hold a solid source chemical reactant therein, the base comprising a first thermal conductor;

a cooling plate in thermal contact with the first thermal conductor, disposed outside of an inside volume of the fill vessel, wherein the cooling plate is configured to maintain the base at or below a first threshold temperature;

a lid at the distal end comprising a second thermal conductor, the lid comprising:

a chemical inlet configured to receive vaporized chemical reactant into the base;

a carrier gas inlet configured to receive a flow of a carrier gas therethrough; and a chemical outlet configured to pass vaporized chemical reactant from the lid, wherein the chemical inlet, the carrier gas inlet and the chemical outlet open to the inside volume of the fill vessel through the lid; and an intermediate layer disposed between the base and the lid and in thermal communication with the lid and the base, the intermediate layer comprising an insulator configured to reduce heat flow between the base and the lid, wherein the lid or the base, or a combination thereof are mechanically coupled to the intermediate layer, wherein the mechanical coupling comprises a gas-tight seal.

2. The intermediate fill vessel of claim 1, wherein the intermediate layer is disposed in contact with both the base and the lid.

3. The intermediate fill vessel of claim 1, further comprising a water cooler configured to maintain the base at or below the first threshold temperature.

4. The intermediate fill vessel of claim 3, wherein the cooling plate is disposed in contact with the base.

5. The intermediate fill vessel of claim 1, wherein the intermediate layer comprises one or more individual chambers including a vacuum.

6. The intermediate fill vessel of claim 1, wherein the first threshold temperature is about 135° C.

7. The intermediate fill vessel of claim 1, further comprising a heating element configured to maintain the lid at or above the first threshold temperature.

8. The intermediate fill vessel of claim 7, wherein the heating element comprises a rod or plate configured to heat the lid via radiation.

9. The intermediate fill vessel of claim 1, wherein each of the chemical inlet, the carrier gas inlet, and the chemical outlet comprise a corresponding valve configured to control a flow of gas therethrough.

10. The intermediate fill vessel of claim 1, wherein the chemical outlet comprises a filter configured to prevent a passage of particulate matter therethrough.

11. The intermediate fill vessel of claim 10, wherein a porosity of the filter is configured to prevent a passage of the reactant therethrough below a second threshold temperature and to allow a passage of the reactant therethrough at or above the second threshold temperature.

12. The intermediate fill vessel of claim 10, wherein the filter comprises at least one of a ceramic or a metal.

13. The intermediate fill vessel of claim 1, wherein a ratio of a height of the base to a height of the lid is greater than about 4.

14. The intermediate fill vessel of claim 1, wherein the intermediate layer is configured to maintain a temperature gradient between the lid and the base of at least 10° C.

15. The intermediate fill vessel of claim 1, wherein a ratio of a height of the lid to a height of the intermediate layer is greater than about 2.

16. The intermediate fill vessel of claim 1, wherein a cross section of the base comprises at least two flat edges.

17. The intermediate fill vessel of claim 1, wherein the intermediate layer comprises a ceramic or metal.

18. The intermediate fill vessel of claim 1, wherein the intermediate fill vessel is sized to be disposed in situ in a solid source chemical reaction chamber.

19. A solid source chemical system comprising:

a solid source chemical intermediate fill vessel comprising:

a proximate end;

a distal end;

a base at the proximate end configured to hold a solid source chemical reactant therein, the base comprising a first thermal conductor;

a cooling plate in thermal contact with the first thermal conductor, disposed outside of an inside volume of the fill vessel, wherein the cooling plate is configured to maintain the base at or below a first threshold temperature;

a lid at the distal end comprising a second thermal conductor, the lid comprising:

a chemical inlet configured to receive vaporized chemical reactant into the base;

a carrier gas inlet configured to receive a flow of a carrier gas therethrough; and a chemical outlet configured to pass vaporized chemical reactant from the lid, wherein the chemical inlet, the carrier gas inlet and the chemical outlet open to the inside volume of the fill vessel through the lid; and an intermediate layer disposed between the base and the lid and in thermal communication with the lid and the base, the intermediate layer comprising an insulator configured to reduce heat flow between the base and the lid, wherein the lid or the base, or a combination thereof are mechanically coupled to the intermediate layer, wherein the mechanical coupling comprises a gas-tight seal.

* * * * *